United States Patent
Harada et al.

(10) Patent No.: US 8,702,285 B2
(45) Date of Patent: Apr. 22, 2014

(54) SEMICONDUCTOR LIGHT EMITTING DEVICE AND VEHICLE LIGHT

(75) Inventors: Mitsunori Harada, Tokyo (JP); Yasuyuki Miyake, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 238 days.

(21) Appl. No.: 13/218,960

(22) Filed: Aug. 26, 2011

(65) Prior Publication Data

US 2012/0051075 A1 Mar. 1, 2012

(30) Foreign Application Priority Data

Aug. 27, 2010 (JP) .................................. 2010-190843

(51) Int. Cl.
*F21V 1/00* (2006.01)

(52) U.S. Cl.
USPC ............. 362/509; 362/84; 362/231; 362/235; 362/606; 313/498; 313/503; 313/506; 313/512

(58) Field of Classification Search
USPC ............ 313/498–512, 110–113; 362/84, 231, 362/235, 293, 509, 555, 606, 612, 617
See application file for complete search history.

(56) References Cited

U.S. PATENT DOCUMENTS

| 2005/0242355 | A1 | 11/2005 | Guenther et al. |
| 2009/0001490 | A1 | 1/2009 | Bogner et al. |
| 2009/0034230 | A1 * | 2/2009 | Lim et al. .................... 362/84 |
| 2010/0149816 | A1 * | 6/2010 | Higashi et al. ............... 362/293 |
| 2010/0177527 | A1 * | 7/2010 | Tsutsumi et al. ............. 362/538 |
| 2010/0315829 | A1 * | 12/2010 | Tokida et al. ................. 362/538 |
| 2011/0147778 | A1 * | 6/2011 | Ichikawa .................... 257/98 |

FOREIGN PATENT DOCUMENTS

| JP | 2005-322923 A | 11/2005 |
| JP | 2008-507850 A | 3/2008 |

* cited by examiner

*Primary Examiner* — Anh Mai
*Assistant Examiner* — Kevin Quarterman
(74) *Attorney, Agent, or Firm* — Kenealy Vaidya LLP

(57) ABSTRACT

A vehicle light is provided which can form a light distribution pattern having a clear cut-off line. The vehicle light can include a semiconductor light emitting device as a light source. The semiconductor light emitting device can include a semiconductor light emitting element having a light emission surface thereof having a first end and a second end and at least one light extracting layer deposited on the light emission surface and including a wavelength conversion layer, and the light extracting layer includes an optical characteristic that can change from the first end to the second end in a direction parallel to the light emission surface so that the semiconductor light emitting device forms a luminance distribution with a maximum luminance at the first end and a minimum luminance at the second end.

13 Claims, 15 Drawing Sheets

Fig. 14A    Fig. 14C
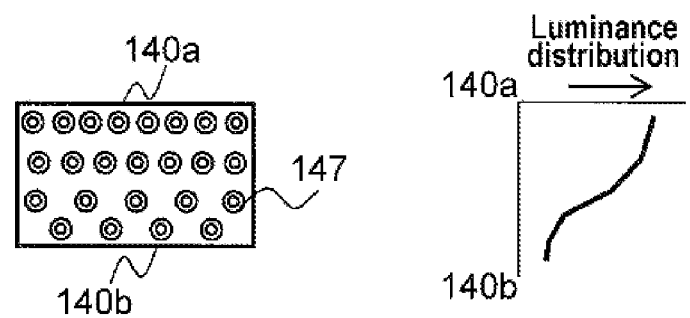
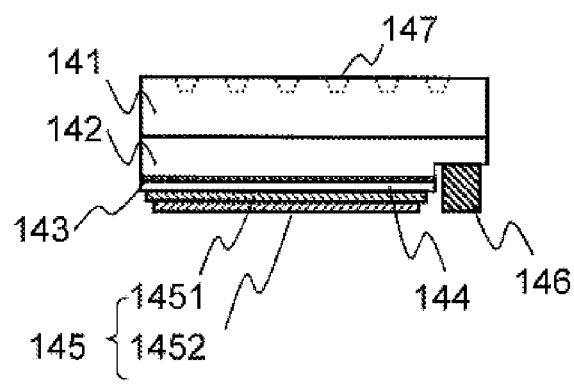
Fig. 14B

SEMICONDUCTOR LIGHT EMITTING DEVICE AND VEHICLE LIGHT

This application claims the priority benefit under 35 U.S.C. §119 of Japanese Patent Application No. 2010-190843 filed on Aug. 27, 2010, which is hereby incorporated in its entirety by reference.

TECHNICAL FIELD

The presently disclosed subject matter relates to a semiconductor light emitting device and a vehicle light. In particular, the presently disclosed subject matter relates to a semiconductor light emitting device and a vehicle light that can form a light distribution pattern having a clear cut-off line.

BACKGROUND ART

Semiconductor light emitting devices can be utilized as light sources for use in vehicles (see, for example, Japanese Patent Application Laid-Open Nos. 2005-322923 and 2008-507850). General semiconductor light emitting devices can include a light emitting device having an LED element and a phosphor for wavelength-converting light emitted from the LED element in combination, and can have a structure wherein a layer in which the phosphor is dispersed (wavelength conversion layer) is deposited on the LED element. A semiconductor light emitting device with the above configuration can provide a luminance distribution which is formed on a light emission surface and in which the luminance gradually decreases from the center of the surface of the wavelength conversion layer as its maximum luminance toward the periphery or a uniform luminance distribution within the light emission surface.

As to a vehicle headlamp, a cut-off line can be formed in the light distribution pattern to prevent the vehicle from directly projecting light to an opposite vehicle (driver). In order to form a clear cut-off line in the light distribution pattern, the maximum luminance portion of the light distribution pattern formed by the light source can be disposed on or near the cut-off line. When the semiconductor light emitting device with the above luminance distribution in which the luminance gradually decreases toward the periphery is used in the above vehicle headlamp, the conventional vehicle headlamp should include a shade or the like to cut and/or block half of the light in the luminance distribution, thereby forming the clear cut-off line. In this case, however, the light utilization efficiency may deteriorate.

Furthermore, in order to form a light distribution pattern with a high far-distance visibility, it is possible to form a luminance gradation where the luminance (brightness) is decreased gradually from the cut-off line to the lower side on a virtual screen in front of the vehicle. In this case, if a semiconductor light emitting device with a uniform luminance distribution is used, formation of the luminance gradation is difficult.

SUMMARY

The presently disclosed subject matter was devised in view of these and other problems and features and in association with the conventional art. According to an aspect of the presently disclosed subject matter, a semiconductor light emitting device and a vehicle light that utilizes the semiconductor light emitting device can be provided to dispose a maximum luminance portion of a luminance distribution on or near the cut-off line of the light distribution pattern.

According to another aspect of the presently disclosed subject matter, a vehicle light made in accordance with principles of the presently disclosed subject matter can include a semiconductor light emitting device as a light source, and a projection optical system for projecting an image of the light source forward to form a light distribution pattern for a headlamp on a virtual vertical screen assumed to be disposed in front of the vehicle light.

The semiconductor light emitting device can include a light emitting element having a light emission surface thereof having a first end and a second end and at least one light extracting layer deposited on the light emission surface and including a wavelength conversion layer. The light extracting layer can include an optical characteristic that can change from the first end to the second end in a direction parallel to the light emission surface so that the semiconductor light emitting device can form a luminance distribution with a maximum luminance at the first end and a minimum luminance at the second end.

The semiconductor light emitting device can be disposed in the vehicle light such that the light distribution of the projected light from the vehicle light can have a maximum luminance (brightness) at a first end side in the vertical direction and a minimum luminance (brightness) at a second end side opposed to the first end side.

A semiconductor light emitting device made in accordance with the principles of the presently disclosed subject matter can have the above described characteristics.

In the semiconductor light emitting device, the optical properties of the light extracting layer can be changed gradually and smoothly from the first end to the second end or changed in a stepped manner. In the latter case, the light extracting layer can include a plurality of light extracting portions having different optical properties and these light extracting portions can be arranged from the first end to the second end of the light emission surface in the order of the magnitude of the luminance.

The optical characteristics of the optical extracting layer in the semiconductor light emitting device herein means the properties being correlated to the luminance of light emitted from a light emission element and exiting therefrom via the light extracting layer (almost equivalent to a light emission efficiency). Specifically, the optical properties can be determined by a density distribution, an average particle diameter, characteristics of a wavelength conversion material contained in the wavelength conversion layer, a surface roughness of the surface of the light extracting layer, a refraction index of the light extracting layer, and the like.

In the semiconductor light emitting device, the semiconductor light emitting element can have a varied luminance distribution on its light emission surface from the first end to the second end opposite thereto in a direction parallel to the light emission surface.

With this configuration, the vehicle light utilizing the semiconductor light emitting device can project light forming a light distribution pattern with a clear cut-off line without wasting light emitted from the semiconductor light emitting device. Since the semiconductor light emitting device can have a luminance distribution gradually decreasing in luminance with a maximum luminance at the first end and a minimum luminance at the second end, the maximum luminance portion of the light can be projected and arranged on or near the cut-off line of the light distribution pattern of the vehicle light, thereby providing the vehicle light with an improved far-distance visibility.

BRIEF DESCRIPTION OF DRAWINGS

These and other characteristics, features, and advantages of the presently disclosed subject matter will become clear from the following description with reference to the accompanying drawings, wherein:

FIGS. 14A, 14B, and 14C are a top view, a cross-sectional side view, and a luminance distribution graph showing one example of a semiconductor light emitting device according to an eight exemplary embodiment;

DESCRIPTION OF EXEMPLARY EMBODIMENTS

A description will now be made below to semiconductor light emitting devices of the presently disclosed subject matter with reference to the accompanying drawings in accordance with exemplary embodiments.

In the following exemplary embodiments, a description will be given of a white light emitting device that can include a plurality of blue light emitting elements (LED) arranged in a line and a wavelength conversion layer containing a wavelength conversion material such as a phosphor that can be excited by blue light and which can emit an orangish yellow fluorescent light so that the additive color mixing of the blue light and orangish yellow light can generate white light (pseudo white light). It should be appreciated that the emission light color of the semiconductor light emitting device is not limited to white, but any combinations of light emitting elements and wavelength conversion materials can be utilized to produce the light emitting device in accordance with various desired specifications.

It should be also appreciated that the drawings illustrate the respective layers, parts, particles, and the like in an exaggerated manner (not necessarily to scale) for facilitating the understanding, and accordingly, the drawings do not limit the presently disclosed subject matter.

Figure 1A:
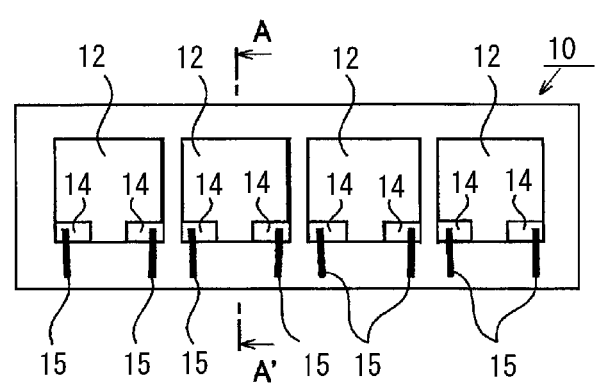
FIG. 1A is a top view showing a semiconductor light emitting device made in accordance with principles of the presently disclosed subject matter.
Figure 1B:
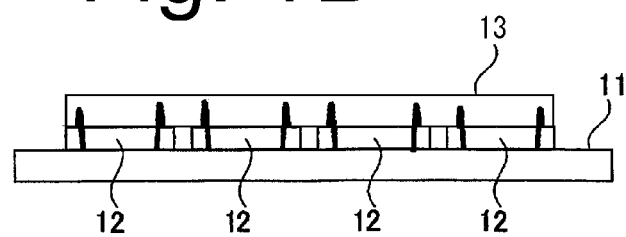
FIG. 1B is a side view of the same.

The presently disclosed subject matter can provide a semiconductor light emitting device 10 as shown in FIGS. 1A and 1B, including a mounting board 11 at least one light emitting element 12 (four in the illustrated example) mounted on the mounting board 11, and a wavelength conversion layer 13 disposed over the at least one light emitting element 12. The mounting board 11 can be a ceramic, silicon, or the like substrate on which a wiring pattern has been formed. It should be noted that the number, the arrangement, and the like of the light emitting elements 12 can be appropriately designed according to the desired specifications.

The light emitting element 12 can be configured such that blue light can exit from its top surface in a direction opposite to the substrate 11 on which the element 12 is fixed (in an upperward direction in the illustrated example). The wavelength conversion layer 13 can be a resin layer in which a wavelength conversion material such as phosphor particles are dispersed so that the phosphor particles can be excited by blue light and can emit orangish yellow fluorescent light. Examples of the wavelength conversion materials include: YAG type phosphors such as $Y_3Al_5O_{12}$:Ce, and the like; BOSE type phosphors such as $(Ba, Sr, Ca)_2SiO_4$:Eu, and the like, αSiAlON type phosphor particle such as $Ca_x(Si, Al)_{12}(O, N)_{16}$, and the like. Electrodes (wire-bonded pad) 14 with the same polarity can be formed on each top surface of the light emitting elements 12, and electrically connected to the wirings formed on the substrate 11 by respective bonding wires 15. Electrodes 14 with a counter polarity to the electrodes 14 on the top surface can be formed on each bottom surface of the light emitting elements 12 (not shown), and can be electrically connected to the electrode pattern formed on the substrate. It should be noted that the wavelength conversion layer 13 can be formed to embed the electrodes 14 on the top surfaces and the bonding wires 15 in part.

The blue light emitted upward from the light emitting element 11 to the top surface can pass through the wavelength conversion layer 13. Part of blue light can excite the phosphor particles contained in the wavelength conversion layer 13 and the phosphor particles can emit orangish yellow fluorescent light. The blue light that has passed the wavelength conversion layer 13 and the orangish yellow fluorescent light can be mixed together so that the additive color mixing of the blue light and orangish yellow light can generate white light (pseudo white light) which exits upward through the top surface thereof.

Figure 2A:
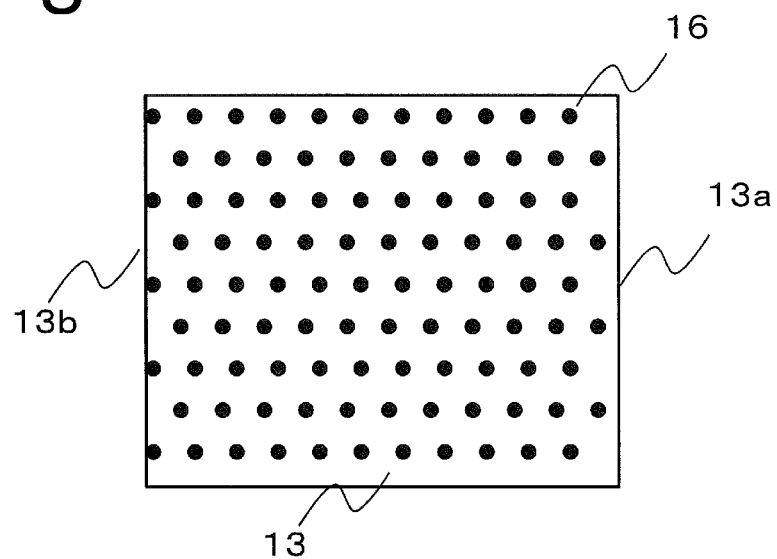
FIGS. 2A and 2B are a top view and a cross-sectional side view illustrating portions of a semiconductor light emitting device according to a first exemplary embodiment, respectively.
Figure 2B:
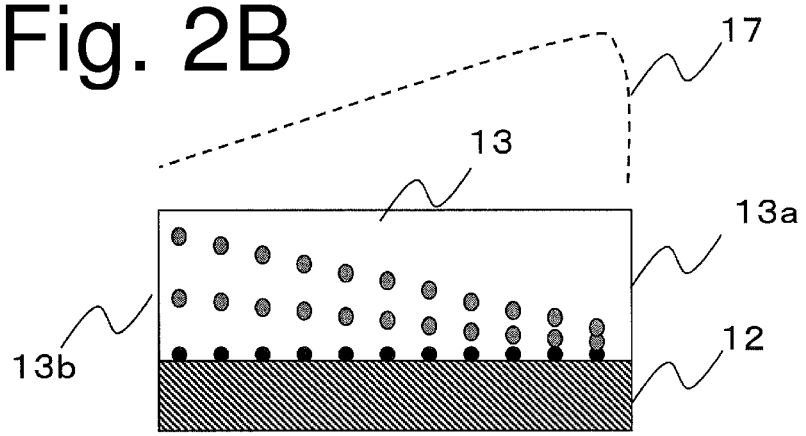

The semiconductor light emitting device 10 of the present exemplary embodiment can have a specific distribution of the phosphor particles contained in the wavelength conversion layer 13 such that the distribution of the phosphor particles 16, when viewed from above the wavelength conversion layer 13 as shown in FIG. 2A, can be uniform over the entire area, meaning that the number of particles per unit area is the same over the entire area. On the other hand, as shown in FIG. 2B, when viewed from the side surface of the wavelength conversion layer 13, the density distribution of the phosphor particles in the thickness direction of the wavelength conversion layer 13 can be changed from a first end side 13a to a second end side 13b. Specifically, at the first end side 13a, the particle density can be high closer to the light emitting element 12 side (lower side in the drawing) whereas the density can be low closer to the wavelength conversion layer 13 side (upper side in the drawing). In contrast, at the second end side 13b, the particle density can be almost uniform over the entire thickness of the wavelength conversion layer 13. In other words, the high particle density near the first end side 13a can be decreased closer to the second end side 13b, resulting in a uniform particle density over the entire thickness of the wavelength conversion layer 13 at the second end side 13b.

Figure 3:
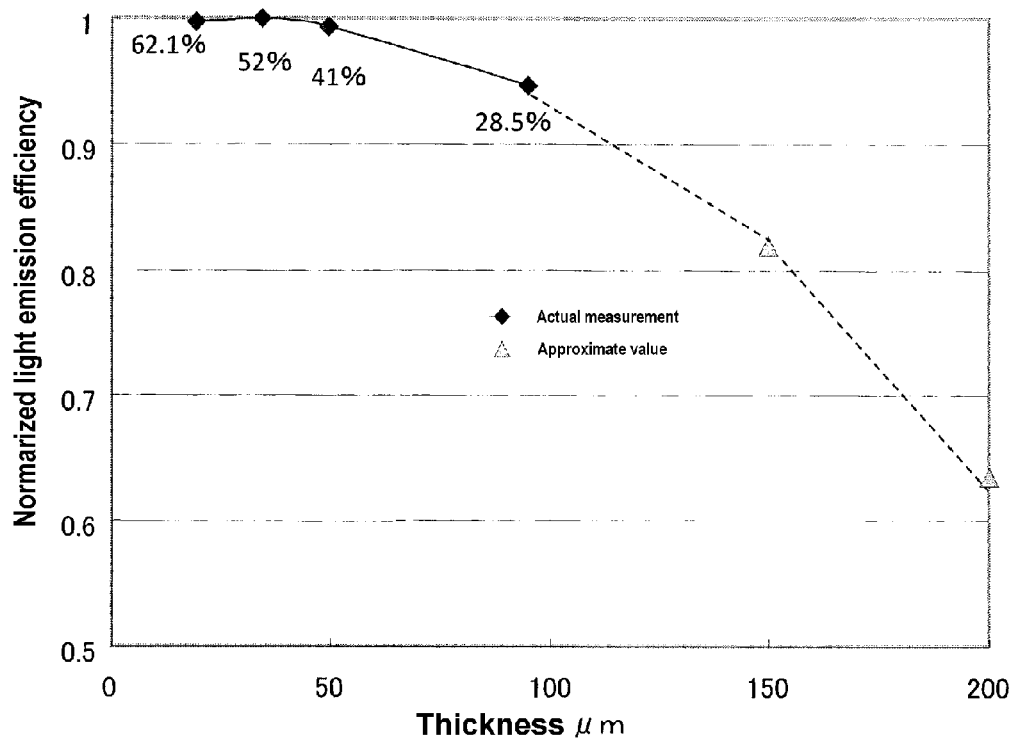
FIG. 3 is a graph showing the change in light emission efficiency when an amount of the wavelength conversion material is constant and the concentration is varied by varying the layer thickness.

It has been known that if the amount of phosphor is the same and the concentration thereof is changed, the amount of light emitted from the wavelength conversion layer can be correlated to the phosphor concentration (density), meaning that a higher phosphor concentration can increase the light emission efficiency. FIG. 3 shows the relationship between phosphor concentration and light emission efficiency. The shown results have been obtained through various experiments on the light emitting device with combinations of a blue light emitting element and various wavelength conversion layers which can be obtained by dispersing a YAG phosphor in a silicone resin. Specifically, the experiments were performed such that various wavelength conversion layers that could achieve the same color temperature were prepared while concentrations of the YAG phosphor were varied, and the thickness of the respective wavelength conversion layers and the light emission efficiency were measured. As clearly understood from the graph of FIG. 3, if the case where the thickness of the layer is 40 µm and the phosphor concentration is 52% is referred to as a standard, the thicker the layer thickness is or the thinner the phosphor concentration is, the lower the light emission efficiency is. Specifically, when the thickness is 50 µm and the phosphor concentration is 41%, the light emission efficiency is lowered to 0.994, and when the thickness is 100 µm and the phosphor concentration is 28.5%, the light emission efficiency is lowered to 0.947. It is believed that the probability of the light emitted from the light emitting element and impinging on the phosphor particle could be increased thereby improving the light emission efficiency.

The wavelength conversion layer 13 shown in FIGS. 2A and 2B can be prepared by realizing the concentration change shown in FIG. 3 through adjusting the density distribution of the phosphor particles contained in the wavelength conversion layer 13. As illustrated, the density of the phosphor particles can be increased at areas closer to the first end side 13a and decreased at areas closer to the second end side 13b. With this density distribution, the resulting wavelength conversion layer 13 can provide a higher light emission efficiency at areas closer to the first end side 13a in the same manner as shown in FIG. 3.

In order to prepare the higher density distribution at areas closer to the first end side 13a, the phosphor particles should be present within a vertically narrower area at areas closer to the first end side 13a. This means that various arrangements of the phosphor concentrated area in the thickness direction of the wavelength conversion layer 13 can be achieved. Examples thereof include the arrangement obtained by inverting the wavelength conversion layer 13 of FIG. 2B upside down. The phosphor particles can be presented at areas closer to the light emitting element in view of the light emission efficiency. Namely, the closer the phosphor particle contained area is to the light emitting element, the higher light emission efficiency can be achieved.

In order to confirm the relationship between the light emission efficiency and the position where the phosphor exists, a wavelength conversion layer was prepared by spraying a material including a silicone resin and a YAG phosphor dispersed therein to one side of a glass plate to a thickness of approximately 35 µm. This wavelength conversion layer with a glass plate was pasted to a blue light emitting element (blue LED) so that the wavelength conversion layer or the glass plate is adjacent to the LED, and both the cases were evaluated for light emission efficiency. The results showed that the brightness in the latter case deteriorated by approximately 13% when compared with the former case.

As shown by dashed line in FIG. 2B, the luminance distribution 17 of the semiconductor light emitting device 10 in the present exemplary embodiment can show the increased luminance distribution from the second end side 13b to the first end side 13a whereby the maximum luminance occurs at the first end side 13a. In the wavelength conversion layer 13 shown in FIGS. 2A and 2B, the varied phosphor concentration in the coated area can be adjusted within the range of 20% to 60%, for example, whereby the luminance can be changed by approximately several % to 20% at both ends in the direction where the phosphor concentration varies. On the other hand, each region by separating the layer 13 in the vertical direction at equal intervals can include the same content of phosphor materials, and accordingly, the respective regions can emit the same colored light (white in the present exemplary embodiment).

A description will now be given of one example of a method for producing the semiconductor light emitting device according to the present exemplary embodiment with reference to FIGS. 4A to 4D. In the method for producing the semiconductor light emitting device according to the present exemplary embodiment, a light emitting element 12 is fixed on a substrate 11 by die bonding or the like, and the lower electrode (not shown) of the light emitting element 12 is electrically and mechanically connected to the corresponding electrode on the substrate 11 while the upper electrode 14 of the light emitting element 12 is connected to the wiring on the substrate 11. This can be achieved by the same conventional production method.

Figure 4A:
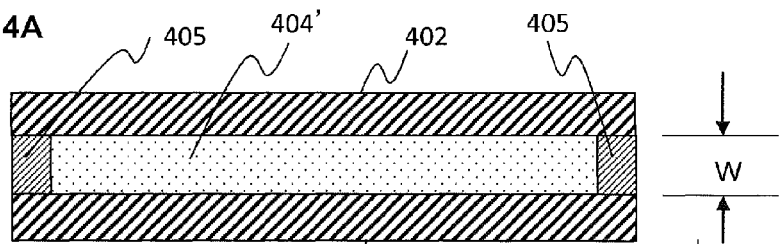
FIG. 4 illustrates a method for producing the semiconductor light emitting device according to the first exemplary embodiment, including (a) a top view showing a mold for forming the wavelength conversion layer, (b) a cross-sectional side view of the mold, (c) a cross-sectional side view illustrating the change occurring when the resin solution for the wavelength conversion layer is cured, and (d) a finishing process.
Figure 4B:
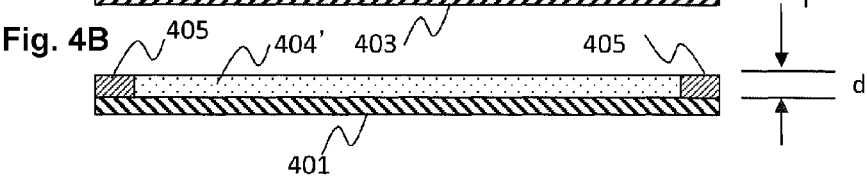
Figure 4C:
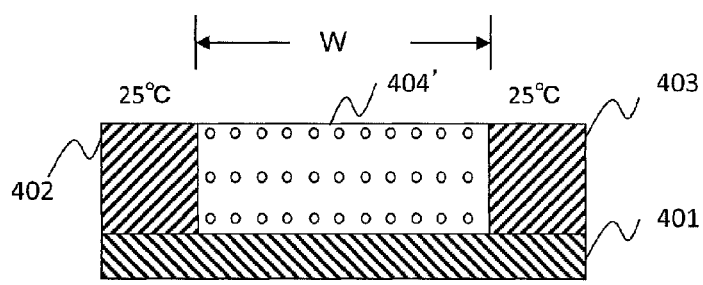

The wavelength conversion layer 13 can be formed on the wired light emitting element 12 according to the steps illustrated in FIGS. 4A to 4D. First, a heat-resistant plate material 401 having a surface with a releasing property is prepared. Materials for the plate material 401 can be a fluorocarbon resin plate or a metal plate with a surface coating film such as a fluorocarbon resin or the like. Then, a pair of heater blocks 402 and 403 are arranged on the surface of the plate material 401 with the releasing property at a distance corresponding to the width W of the wavelength conversion layer 13, and heat insulation materials 405 are filled in respective spaces between the heater blocks 402 and 403 at both ends of the plate materials 401. The thicknesses of the heater blocks 402 and 403 and the heat insulation materials 405 may be a thickness almost the same as the designed thickness d of the wavelength conversion layer 13 as shown in FIGS. 4A and 4B or slightly thicker than the designed thickness d in consideration of heat shrinkage of the resin constituting the wavelength conversion layer. Next, as shown in FIG. 4C, a material 404' for constituting the wavelength conversion layer is poured into a space defined by the heater blocks 402 and 403 and both the heat insulation materials 405 to fill the space therewith. The material 404' for constituting the wavelength conversion layer can include a transparent thermosetting resin as a matrix, a wavelength conversion material such as a phosphor, and if required, a filler such as silica, titanium oxide. Examples of the used resin include an epoxy resin, a silicone resin, and the like. Among them, a silicone can be effectively used because the viscosity thereof is hard to lower. A filler can be used for adjusting the viscosity of the sealing resin or a diffusion material for reducing color unevenness. The amounts of phosphor and filler used are not specifically limited, but the total amount of the phosphor and filler with respect to the resin in weight may be 5 to 80 wt %, and possibly 20 to 50 wt %.

Then, the heater blocks 402 and 403 are activated to heat the resin for curing. During the curing, the heater blocks 402 and 403 should be controlled so that one of them heats at higher temperatures than the other thereof. Specifically, one of the heater blocks 402 and 403 (in the illustrated example, 402) can be controlled to heat at temperatures equal to the hardening temperature of the resin or higher, for example, set to about 200° C. while the other (403) thereof can be controlled to heat at temperatures lower than the hardening temperature of the resin, for example, set to about 50 to 100° C. In this manner, a heat gradient can be generated between the heater blocks 402 and 403 so that the portions of resin 404' poured in the space closer to the high-temperature heater block 402 can be rapidly hardened. On the other hand, the portion of resin 404' closer to the low-temperature heater block 403 can be hardened later, meaning that the fluidity of the resin can be maintained for a relatively longer time, and accordingly, the phosphor and filler dispersed in the resin can be settled. The curing rate of the resin is faster at areas closer to the high-temperature heater block 402 while the settlement rate of the particles in the resin is faster at areas closer to the low-temperature heater block 403. As a result, when the resin is almost cured to prevent the particles in the resin from moving, the particle distribution in the thickness direction of the resin can be continuously varied from the high-temperature heater block 402 to the low-temperature heater block 403 to achieve uniform distribution closer to the high-temperature heater block 402 and the high density distribution closer to the low-temperature heater block 403

In this state, if required, the low-temperature heater block 403 can be controlled to be at a higher temperature, for example, 200° C., to completely cure the resin.

Figure 4D:
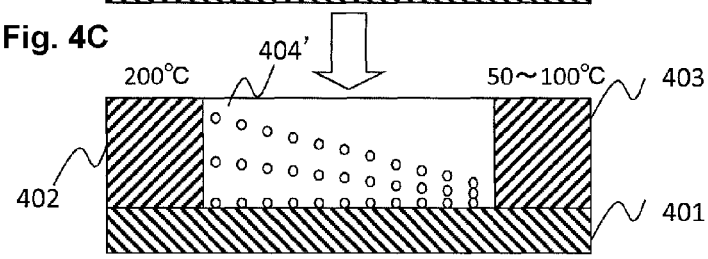
Figure 4D:
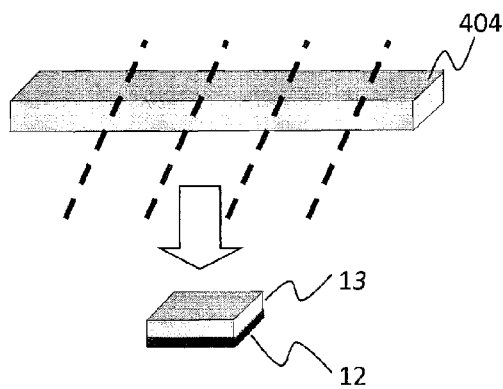

Next, the resin plate 404 containing the wavelength conversion material is released from the plate material 401 and the like, and then, is cut into a size corresponding to one light emitting element 12 as shown in FIG. 4D. The cut resin plate 404 (wavelength conversion layer) is pasted on the wired light emitting element 12 to complete the wavelength conversion layer 13. During fabrication, the direction of the pasted resin plate 404 should be aligned such that the end area with the maximum density of the phosphor particles in the wavelength conversion layer 13 is coincident with the end portion where the maximum luminance can be achieved in the completed light emitting device for forming the cut-off line.

In this manner, a light emitting device with the luminance distribution 17 continuously changing from the first end to the second end can be obtained. With this method, the wavelength conversion layer in which the density distribution of the phosphor particles can be continuously varied can be easily manufactured by separately controlling the temperatures of a pair of heater blocks to cure the resin plate during the fabrication of the resin plate as the wavelength conversion layer.

In the present exemplary embodiment, the wavelength conversion layer constituting the semiconductor light emitting device can have a density distribution of phosphor particles with a certain gradient in the direction parallel to the light emission surface. Accordingly, the semiconductor light emitting device can provide a luminance distribution with a maximum luminance at or closer to the first end and continuously decreasing toward the second end. With this configuration, the cut-off line formed by the semiconductor light emitting device can be achieved without using a shade or shielding plate and any waste of light emitted therefrom. In addition to this, improved far-distance visibility can be achieved by corresponding the light distribution from the cut-off line to the lower side to the gradation of the luminance distribution decreasing from the first end to the second side in luminance.

FIGS. 2A, 2B and 4A to 4D illustrate a single light emitting element. If the light emitting device is configured to include a plurality of light emitting elements arranged in line as shown in FIG. 1, the resin plate serving as the wavelength conversion layer can be in the form of a single plate for covering the array of all the light emitting elements. This configuration can be applied to any of the following exemplary embodiments.

Although FIG. 1 illustrates the light emitting element that includes the electrodes on the upper and lower surfaces, respectively, the light emitting element may include both the electrodes on the same surface. Further, the electrical connection between both the electrodes of the light emitting element and the wiring on the substrate can be any methodology and is not limited to the bonding wire, but can include a bump connection, an eutectic connection, and the like. This configuration can be applied to any of the following exemplary embodiments.

Furthermore, the above exemplary embodiment describes a case where the phosphor can emit orangish yellow fluorescent light, but the presently disclosed subject matter is not limited thereto, and any phosphor and combination of phosphors can be utilized, such as a combination of phosphors that can emit greenish yellow light and red light, a combination of phosphors that can emit greenish yellow light, red light, and orangish yellow light, and the like in accordance with the desired specifications.

The semiconductor light emitting device according to the present exemplary embodiment can be configured in the same manner as the first exemplary embodiment shown in FIG. 1, and include a mounting substrate 11, at least one light emitting element 12 disposed on the substrate 11, and a wavelength conversion layer formed on the element 12. In the present exemplary embodiment, the phosphor particles contained in the wavelength conversion layer can be distributed in accordance with a particular particle distribution with a gradient. With reference to FIGS. 5A to 5D, a description will now be given of the different features from the first exemplary embodiment.

Figure 5A:
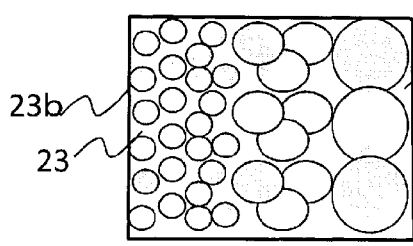
FIGS. 5A and 5B are a top view and a cross-sectional side view showing a semiconductor light emitting device according to a second exemplary embodiment.
Figure 5B:
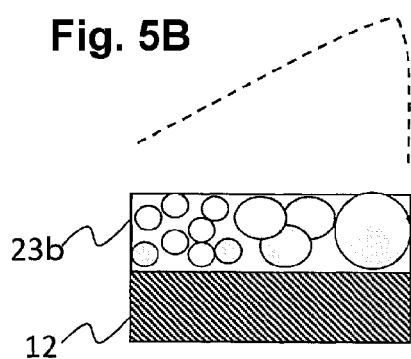

The semiconductor light emitting device of the present exemplary embodiment can be configured to include a wavelength conversion layer 23 containing a phosphor particle, the distribution of which is controlled as shown in FIG. 5B so that the particle diameter of the phosphor particles contained in the wavelength conversion layer is changed from the first end side 23a to the second end side 23b with the maximum particle diameter at the first end side 23a and the minimum particle diameter at the second end side 23b. Specifically, the average particle diameter range of the phosphor particle may be a range of 1 µm to 50 µm, and the particle diameter can be changed within the above range.

Figure 5C:
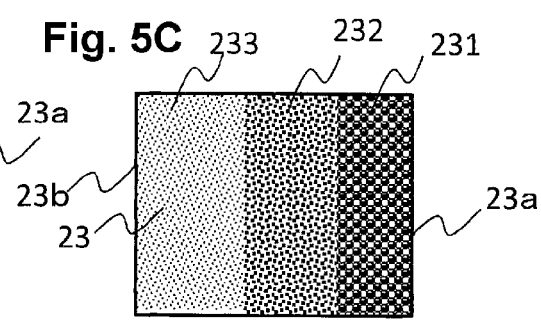
FIGS. 5C and 5D are a top view and a cross-sectional side view showing a modified example thereof.
Figure 5D:
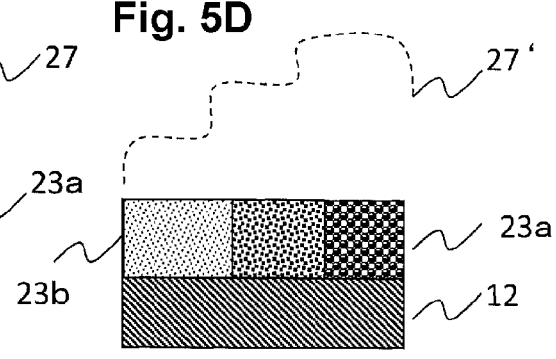

It should be noted that the change of particle diameter can be achieved continuously as shown in FIGS. 5A and 5B or in a stepped manner as shown in FIGS. 5C and 5D. In the latter case, the wavelength conversion layer 23 can include a plurality of divided portions 231, 232 and 233 (three in the illustrated drawing) in parallel with the first end side 23a of the wavelength conversion layer 23 so that the average particle diameter is made smaller from the first end side to the second end side. For example, in one embodiment, the average particle diameter at the divided portion 231 closer to the first end side 23a can be 20 to 50 µm, the average particle diameter at the divided portion 232 closer to the center area can be approximately 15 µm, and the average particle diameter at the divided portion 233 closer to the second end side 23b can be approximately 5 µm. It should be noted that the particle diameter distribution of the particles can be a certain range and accordingly the portions 231 to 233 naturally can include particles that are larger or smaller than the average particle diameter. However, the above difference in average particle diameter can still form a gradient of particle diameters as a whole. It should be noted that when the particle diameter is varied in a stepwise manner, the number of the divided portions in the wavelength conversion layer is not limited to three and can be determined in accordance with the production method and the like. The total amount of the contained particles can be uniform over the entire wavelength conversion layer 23 irrespective of the sizes of the particles.

Figure 6:
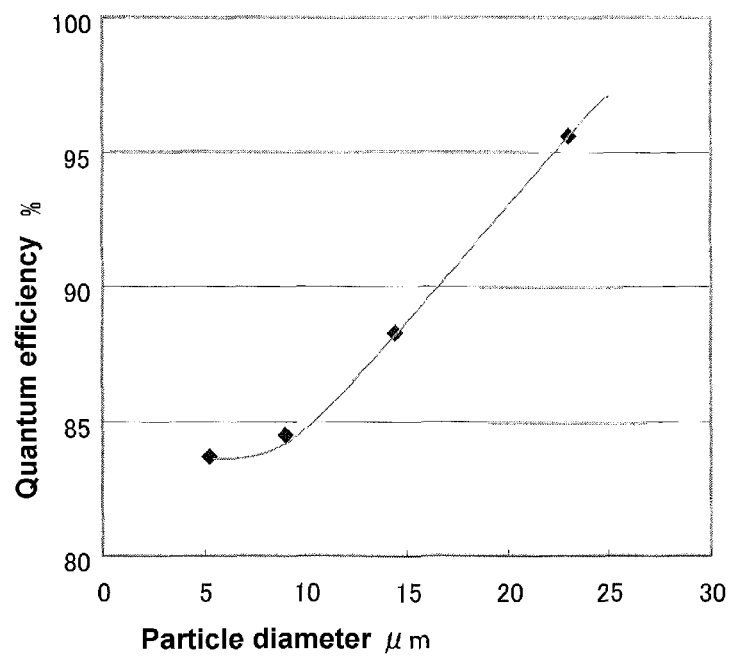
FIG. 6 is a graph showing the change in light emission efficiency according to the variation of particle diameter.

In general, the phosphor particles with a particle diameter up to 50 µm can have a higher light emission efficiency with a larger particle diameter. FIG. 6 shows the relationship between the particle diameter of YAG phosphor and the light emission efficiency (actually measured values). As seen from the graph of FIG. 6, the light emission efficiency of phosphor with a particle diameter of 25 µm can be improved by 10% or higher with regard to the light emission efficiency of a phosphor with a particle diameter of 5 µm. Accordingly, as shown in FIGS. 5A to 5D, the wavelength conversion layer 23 can provide a particle distribution such that the phosphor particle with a larger particle diameter is present at an area closer to the first end 23a. As can be seen from FIGS. 5B and 5D, the luminance distribution can show the gradually increased luminance from the second end side 23b to the first end side 23a and the maximum luminance at the first end side 23a. If the average particle diameter is changed from several µm to several tens µm from the second end side to the first end side, the luminance can be increased by approximately 10% to 15% at the first end side with respect to the luminance at the second end side as a reference. On the other hand, each portion by separating the wavelength conversion layer 23 in the vertical direction at equal intervals can provide the same concentration of the phosphor particles, and accordingly, the respective portions can emit the same colored light (white in the present exemplary embodiment).

A description will now be given of one example of a method for producing the semiconductor light emitting device according to the present exemplary embodiment with reference to FIGS. 7 to 8. It should be noted that the present exemplary embodiment can also include the preparation of the wired light emitting element in the same manner as the conventional production method.

Figure 7:
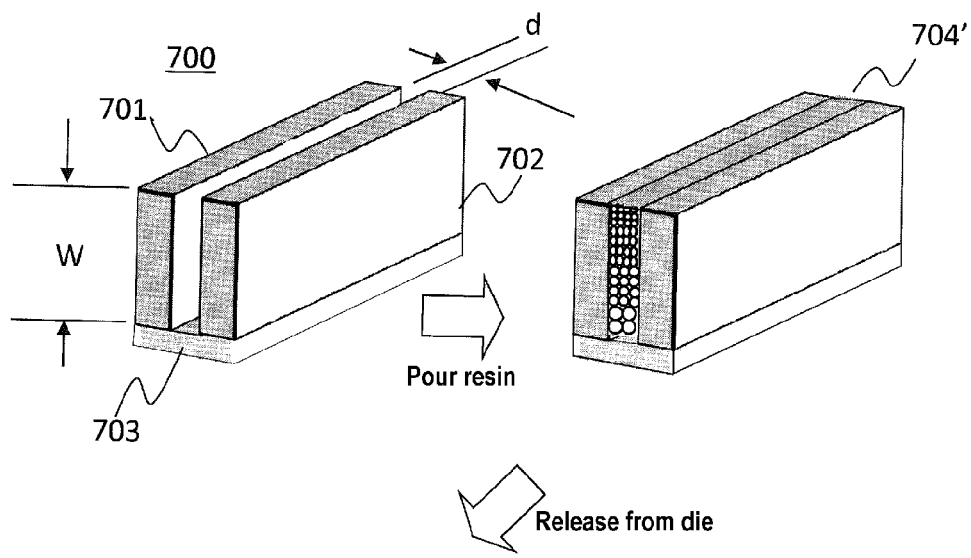
FIG. 7 illustrates a method for producing the semiconductor light emitting device according to the second exemplary embodiment.
Figure 7:
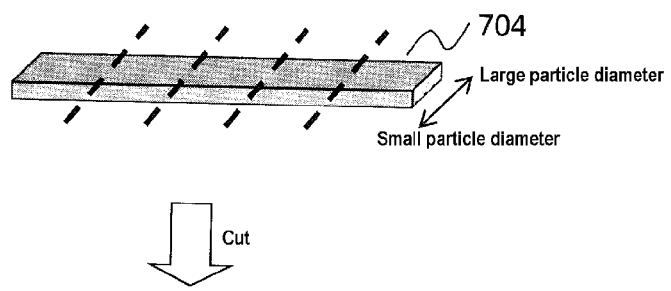
Figure 7:
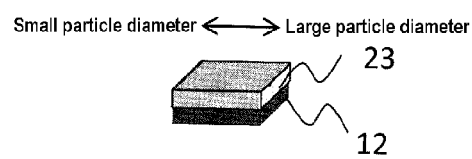

FIG. 7 shows the method for producing a wavelength conversion layer in which the average particle diameter is continuously changed as shown in FIG. 5A. The production method can utilize the fact that the settlement rate of phosphor particles naturally changes according to the particle diameter. First, a mold 700 for use in curing the material constituting the wavelength conversion layer can include two side plates 701 and 702 and a bottom plate 703. The height (vertical size) of the side plate 701 (702) can be the same size as the width W of the wavelength conversion layer, and the distance between the two side plates can be the same as the thickness d of the light emitting device. Then, phosphor particles with a plurality of types of phosphor particles having different average particle diameters or phosphor particles with a larger particle diameter distribution range, and if required, a filler can be added to a resin such as a silicone resin before being cured, thereby preparing resin liquid 704' for the wavelength conversion layer. The liquid 704' can then be poured. The poured resin liquid 704' is not cured immediately after pouring, but is allowed to stand for a period of time until the phosphor particles in the resin are settled with respective settlement rates. During this period of time, particles with a relatively large diameter may settle at a higher settlement rate so that they move to the bottom and closer to the mold 700, while particles with a relatively small diameter can remain at an upper area because of a slower settlement rate. Accordingly, the smaller particles are present at the upper area and the larger particles are present at the lower area. This can generate the particle diameter distribution of phosphor particles in the vertical direction of the mold 700. The time period during which the distribution is generated is dependent on the viscosity of used resin, the particle diameter range, and the like, and may be approximately 30 min to 120 min.

After the particle diameter distribution is adjusted so that the distribution is varied in the vertical direction, the mold 700 is heated to cure the poured resin. The resin can be cured after a sufficient time for settlement of the particles has elapsed, or after the settlement of the particles has been achieved to some extent while relatively low temperature heating is performed. In this manner, the curing of the resin can be controlled while the difference in settlement rates between the particle diameters is utilized, thereby achieving a particle diameter distribution that is vertically and continuously varied.

After curing, the resin plate 704 for the wavelength conversion layer is taken out from the mold 700, and cut into a size corresponding to the light emitting element 12, and pasted onto the wired light emitting element 12 to complete the wavelength conversion layer 23. During fabrication, the direction of the pasted resin plate 704 should be aligned such that the end area with the maximum particle diameter of the phosphor particles in the wavelength conversion layer 23 is coincident with the end portion where the maximum luminance can be achieved in the completed light emitting device for forming the cut-off line.

Figure 8:
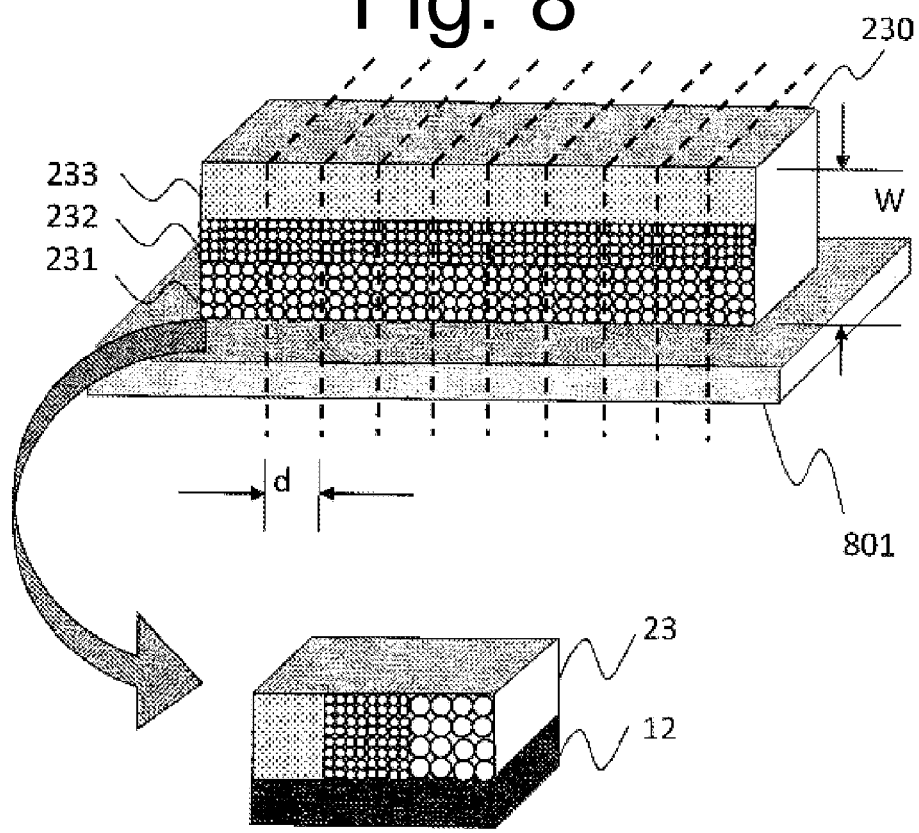
FIG. 8 illustrates a method for producing the semiconductor light emitting device according to a modified example thereof.

FIG. 8 illustrates a method for producing the wavelength conversion layer in which the average particle diameter is varied in a stepwise manner as shown in FIG. 5D. In this production method, a plurality of phosphors having respective different average particle diameters are prepared and separately dispersed in transparent resin such as silicone resin, so that a plurality of resin liquids for the wavelength conversion layer can be prepared in the same number as the types of phosphors.

Then, the respective resin liquids are coated by printing or using a like method on a plate material (or film) 801 having a surface release property so that the various resin liquids having different average particle diameters are layered in the order of the size of the average particle diameter. The layered structure is cured to produce a block 230 in which a plurality of resin layers 231, 232, and 233 are formed. It should be appreciated that the thickness of the block 230 in the layered direction can be the same as the width w of the light emitting element 12, for example, approximately 1 mm. Next, the block 230 is cut to have the same width as the designed thickness d of the wavelength conversion layer 13, and the cut block is pasted onto the light emitting element 12. In this case, the direction of the pasted resin block 230 should be aligned such that the end area with the maximum particle diameter of the phosphor particles in the block 230 is coincident with the end portion 23a where the maximum luminance can be achieved in the completed light emitting device for forming the cut-off line.

In accordance with the production method shown in FIGS. 7 and 8, the light emitting device with the luminance distribution 27, 27' continuously changed from the first end to the second end as shown in FIG. 5A or 5C can be obtained. The method in FIG. 7 can be achieved easily because a single resin liquid for the wavelength conversion layer is enough for the purpose. On the other hand, the method in FIG. 8 does not need adjustment of the curing of the resin and the settlement rate, but only utilizes a simple printing of various resin liquids having respective particles with different average diameters. The amount of phosphor contained in the entire wavelength conversion layer can be even with ease, so that the respective portions can emit the same (uniform) colored light.

According to the present exemplary embodiment, the wavelength conversion layer constituting the light emitting device can have a particle distribution of phosphor particles with a gradient in the direction parallel to the light emission surface, so that high luminance can be achieved at the first end side while the luminance distribution can be continuously decreased to the second end side.

The semiconductor light emitting device according to the present exemplary embodiment can also have a structure that includes at least one light emitting element mounted on a mounting substrate and a wavelength conversion layer formed thereon similarly to the first and second exemplary embodiments. Once difference between the third exemplary embodiment and the previous exemplary embodiments is that the types of the phosphor contained in the wavelength conversion layer 33 can be varied while clearly being separated from each other. The following provides an additional description of these differences.

As a combination of phosphor with a blue light emitting element for generating white light, in addition to the yellow light emitting phosphor, a green light emitting phosphor and a red light emitting phosphor can be considered. Examples of the green light emitting phosphors include $Y_3(Al,Ga)_5O_{12}$:Ce, $Lu_3Al_5O_{12}$:Ce, $CaSc_2O_4$:Ce, $(Ba,Sr)_2SiO_4$:Eu (BOSE phosphor), and $(Si,Al)_6(O,N)_8$:Eu (βSiAlON phosphor). Examples of the red light emitting phosphors include $Ca_2Si_5N_8$:Eu and $CaAlSiN_3$:Eu. The green light emitting phosphor and the red light emitting phosphor can be mixed in an appropriate ratio so that the light from the phosphors and blue light emitted by the LED can generate white light in the same manner as in the case where a yellow light emitting phosphor is used. Although the light emission efficiency may be higher in the case of a yellow light emitting phosphor than in the case of other phosphors, the present exemplary embodiment can utilize the difference in light emission efficiency between various phosphors, or utilize the difference in luminance.

Figure 9:
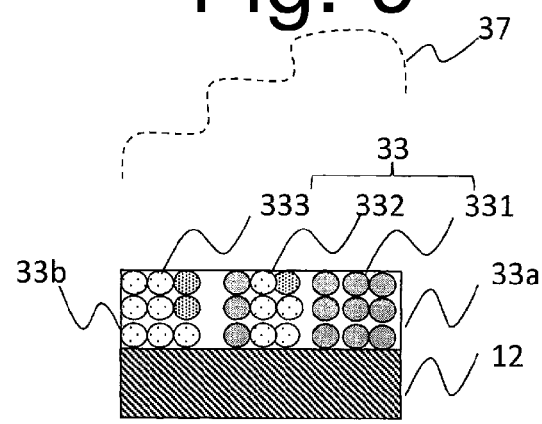
FIG. 9 is a cross-sectional side view illustrating portions of a semiconductor light emitting device according to a third exemplary embodiment.

FIG. 9 shows one example of the semiconductor light emitting device according to the present exemplary embodiment. As shown, the semiconductor light emitting device according to the present exemplary embodiment can include the wavelength conversion layer 33 separated vertically into a plurality of portions 331 to 333 from the first end side 33a (three in the illustrated example), with the portions 331 to 333 including respective different combinations of phosphor types. The portion 331 closest to the first end side 33a can include only one type of phosphor, i.e., the yellow light emitting phosphor. The portion 333 closest to the second end side 33b can include two types of phosphors, i.e., the green light emitting phosphor and the red light emitting phosphor. The intermediate portion 332 can include three types of phosphors, the green, red, and yellow light emitting phosphors. It should be noted that the amounts of respective phosphors can be adjusted so that the generated light has the same color at any portions. As one example, to which the presently disclosed subject matter is not limited, a silicone resin is used as the resin, the yellow light emitting phosphor can include $Y_3Al_5O_{12}$:Ce, the green light emitting phosphor can include $Y_3(Al,Ga)_5O_{12}$:Ce, and the red light emitting phosphor can include $CaAlSiN_3$:Eu. In this case, the portion 331 can include the yellow light emitting phosphor in an amount of 18 wt % with respect to 82 wt % of the resin, the portion 333 can include the green light emitting phosphor in an amount of 17 wt % and the red light emitting phosphor in an amount of 3 wt % with respect to 80 wt % of the resin, so that the same color temperature (5000 K) can be achieved. The intermediate portion 332 can include the yellow light emitting phosphor and the green and red light emitting phosphors in an appropriate ratio, but for example, in a ratio of 20:80 to 80:20, and possibly in a ratio of 40:60 to 60:40. The setting of such ratios can maintain the continuity of color or luminance at the boundaries with the portion 331 and with the portion 333.

Accordingly, the semiconductor light emitting device according to the present exemplary embodiment can include various phosphors contained in the wavelength conversion layer 33 in various combinations from the first end side to the second end side. This configuration can form a luminance distribution 37 with a luminance gradient due to the difference in light emission efficiency of the phosphors. FIG. 9 shows an example in which the number of the divided portions of the wavelength conversion layer 33 is three, but the number can be appropriately set in accordance with the desired specifications and the production method, and the like.

The semiconductor light emitting device according to the present exemplary embodiment can be produced in the same or similar method to the production method for the light emitting device of the second exemplary embodiment as shown in FIG. 5D. Namely, the light emitting device of the second exemplary embodiment can be produced by utilizing a plurality of resin liquids each containing a phosphor with different average particle diameters. In the present exemplary embodiment, instead of the phosphor having different average particle diameters, a plurality of resin liquids with different combinations of phosphors are prepared. These resin liquids can be sequentially deposited on a plate material to form a block including a plurality of layers. Then the block can be cut in the thickness direction to complete the wavelength conversion layer which can be pasted onto a wired light emitting element. In this case, the direction of the pasted resin block should be aligned such that the end area with the single phosphor is coincident with the end portion where the maximum luminance can be achieved in the completed light emitting device for forming the cut-off line.

According to the present exemplary embodiment, the combination of the phosphors constituting the wavelength conversion layer can be changed in ratio and type from the first end to the second end, and use of the difference in light emission efficiency of the used phosphor can produce the desired luminance distribution with a gradient from the first end to the second end. The present exemplary embodiment can provide the same advantageous effects as the first and the second exemplary embodiments.

In the previous first to third exemplary embodiments, each of the wavelength conversion layers can be prepared so that the luminance distribution can be adjusted with a luminance gradient by gradually varied densities, particle diameter distributions, and combinations of the contained phosphor particles. In contrast, the present exemplary embodiment can be prepared so that the luminance distribution can be adjusted with a luminance gradient by utilizing, as a wavelength conversion layer, a glass or a ceramic having a light guiding function and a function to impart the surface (light emission surface) a luminance gradient.

Figure 10:
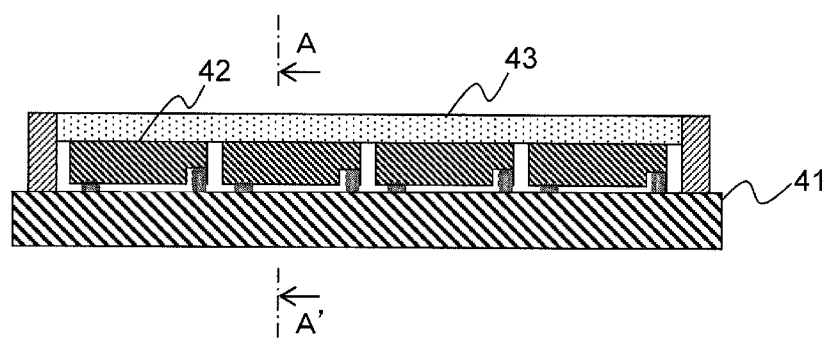
FIG. 10 is a cross-sectional side view illustrating portions of a semiconductor light emitting device according to a fourth exemplary embodiment when taken along a direction of the arrangement of the light emitting elements.

FIG. 10 is a cross-sectional side view of a semiconductor light emitting device 40 according to the present exemplary embodiment. As shown, the light emitting device 40 can include a mounting substrate 41, at least one light emitting element 42 mounted on the mounting substrate 41, and a wavelength conversion layer 43 formed on the light emitting element 42. On the side surfaces of the wavelength conversion layer 43, a light reflection layer 44 made of a white resin or the like can be formed. In the first exemplary embodiment, the connection between the mounting substrate 11 and the light emitting element 12 can be achieved by bonding a wire or the like. In the present exemplary embodiment, the semiconductor light emitting device can have a light emitting element 42 including a sapphire substrate and an anode and a cathode formed on one surface of the substrate so that the light emitting element 42 can be connected on the substrate 41 via connection bumps. However, the type of connection is not limited to the above.

The wavelength conversion layer 43 can be a glass in which phosphor particles are dispersed, or a phosphor ceramic. The phosphor ceramic can be formed of a sintered compact prepared by firing a phosphor powder at high temperatures. In general, glass or ceramics can have higher light guiding properties than resins, and accordingly, the light amount to be projected forward can be controlled by adjusting the surface roughness of the light emission surface. The present exemplary embodiment can utilize this function of glass or ceramics to control the luminance distribution of the light emitting device.

Figure 11:
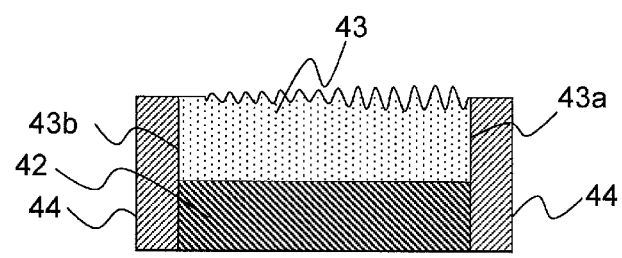
FIG. 11 is a cross-sectional view of the semiconductor light emitting device taken along line A-A' in FIG. 10.

FIG. 11 schematically shows the surface shape of the wavelength conversion layer 43. As shown, the surface of the wavelength conversion layer can be changed from a minor surface to a continuously roughened surface. The surface roughness Ra at the first end side 43a where the maximum surface roughness is achieved can be 0.5 µm or greater, 5 µm or greater, and possibly 10 µm or greater. The surface roughness Ra at the second end side 43b can be 0.1 µm or lower, serving as a mirror surface. The concavo-convex shape can have a mountain-valley cross section, a triangular cross section, a trapezoidal cross section, and other cross sections including an inclined surface. The convex portions can be randomly or regularly arranged.

If the surface roughness is continuously varied over the entire surface, the mirror surface can totally reflect the light from the wavelength conversion layer 43 at the interface between air and the layer (light emission surface) in a certain ratio, and accordingly, the ratio of light that propagate inside the wavelength conversion layer 43 can increase. Among the light that propagates inside the wavelength conversion layer 43, some can be directed to the first end side 43a by being reflected by the light reflection layer 44 at the second end side 43b. In contrast, at the area where the surface roughness of the light emission surface is large, the light emitted from the light emitting element and the phosphor can project therethrough in a larger ratio in addition to the propagated light. As a result, the amount of light projected through the area can be significantly increased. Accordingly, a maximum luminance in the forward direction can be achieved at the first end side 43a whereas a minimum luminance can be achieved at the second end side 43b. Although the increased amount of light may depend on the width of the wavelength conversion layer 43 (distance between the first end side and the second end side), if the surface roughness Ra at the first end side 43a is set to about 5 µm, the luminance at the first end side can be increased by approximately 10% larger than that at the second end side.

Next, a description will be given of the production method of the present exemplary embodiment. In the present exemplary embodiment, the preparation of the wired light emitting element is the same as the previous exemplary embodiments, and a description thereof will be omitted here.

The production method for the wavelength conversion layer having a gradually varied surface roughness may include two exemplary methods similar to the second exemplary embodiment. One is a method of changing the surface roughness inside a plate material for the wavelength conversion layer and the other is a method of preparing a plurality of plate materials for the wavelength conversion layer, each having a different surface roughness. It should be appreciated that the method for adjusting the surface roughness can be any known method such as sand blasting, dry etching, grinding, and the like, which can be selected appropriately in accordance with the desired surface shape to be formed.

Figure 12:
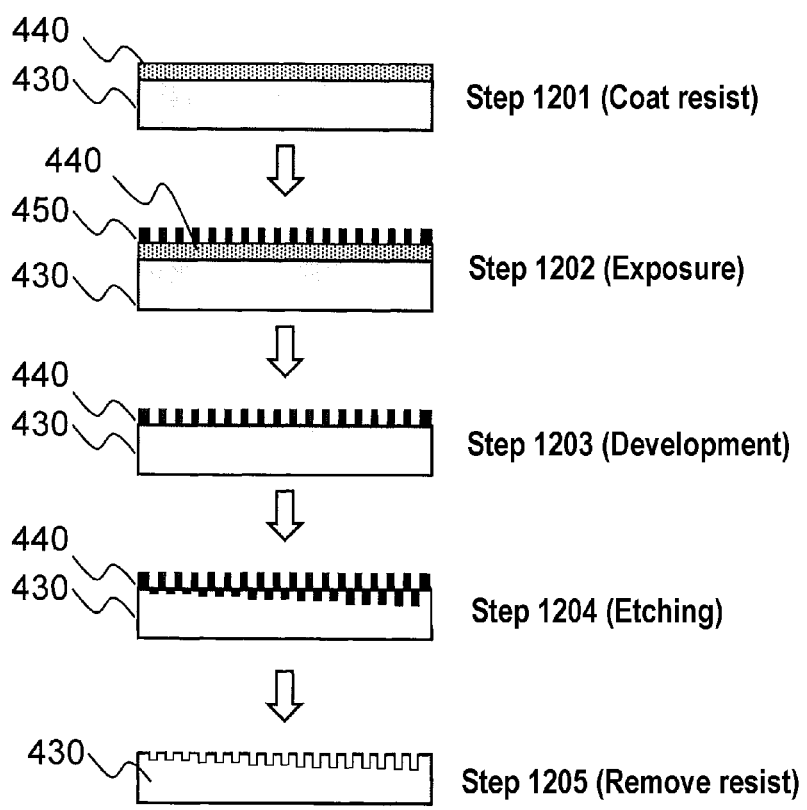
FIG. 12 illustrates a method for producing the semiconductor light emitting device according to a forth exemplary embodiment.

A method of changing the surface roughness inside a plate material for the wavelength conversion layer will be described with reference to FIG. 12. First, a positive type resist 440 is coated over the surface of a glass plate 430 or a plate material 430 for a wavelength conversion layer (for example, YAG plate) (Step 1201). Then, the resist 440 is exposed while masks 450 that are different from each other in the respective areas 431, 432 and 433 (three in the illustrated example). For example, an entire surface is masked for forming the area 431, and different masks 450 with different opening sizes can be used for forming the respective areas 432 and 433 (Step 1202). It should be appreciated that the same mask with the same opening size can be used while the exposure conditions such as an exposure time, angle, and the like can be adjusted for forming different surface roughnesses.

Next, the resist 440 is developed to remove the unexposed portions (Step 1203). Accordingly, the cured resist with a shape corresponding to the openings of the mask (or the exposed amount) can remain on the plate material 430 and the plate material can be exposed in part at the resist-removal portions. The exposed portions of the plate material can be etched by RIE (reactive ion etching) (Step 1204). Finally, the resist 440 on the plate material 430 can be removed by a remover to complete the plate material for the wavelength conversion layer on which predetermined surface roughnesses can be imparted at the respective areas. The surface roughness can be controlled by the size of the opening of the mask, the etching conditions, or the like. The resist type is not limited to the positive type, and any negative type can be utilized to producing the plate material 430 having different surface roughness areas.

After the plate material 430 having three different surface roughness areas is completed, it is cut according to the size of the used light emitting element, and is pasted onto the light emitting element to complete the semiconductor light emitting device according to the present exemplary embodiment. If the light reflection layer 44 is required, after the pasting process, a white resin layer can be provided on the respective side faces of the light emitting element and the wavelength conversion layer.

The method for preparing a plurality of plate materials for the wavelength conversion layer, each having a different surface roughness can be achieved by preparing a block with layered plate materials with different surface roughnesses (layer deposition can be achieved by the same or similar method to the second or third exemplary embodiment and with reference to FIG. 8), and then cutting the block in a direction perpendicular to the layered direction.

According to the present exemplary embodiment, the material for the wavelength conversion layer can impact the light guiding function, and the surface thereof can be roughened from the first end side to the second end side continuously and gradually to produce a luminance distribution gradually varied from the first end side to the second end side with a certain luminance gradation. This configuration can also provide the same or similar advantageous effects to those of the first to third exemplary embodiments.

Figures 13A, 13B:
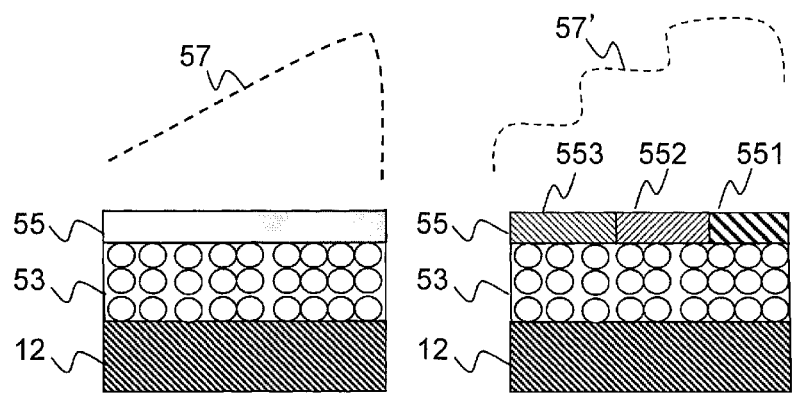
FIG. 13A is a cross-sectional view of a semiconductor light emitting device according to a fifth exemplary embodiment.
FIG. 13B is a cross-sectional view of a semiconductor light emitting device of a modified example thereof.

The present exemplary embodiment is the same as the fourth exemplary embodiment in that the function for forming a luminance gradient in the luminance distribution is imparted to the light emission surface of the light emitting device. In the fourth exemplary embodiment, the function can be achieved by changing the surface roughness across the entire surface with a certain luminance gradient. In contrast, the present exemplary embodiment can include a wavelength conversion layer 53 and a transparent plate material 55 (or a light extracting layer), wherein the light emission surface of the transparent plate material is configured to have a varied surface roughnesses with a gradient. FIG. 13A shows an example where the surface of a single plate material 55 is provided with a surface roughness gradient, and FIG. 13B shows another example where the plate material 55 can include three portions 551, 552, and 553 with different respective surface roughnesses. In the drawings, 57 and 57' denote the luminance distribution.

Examples of the transparent plate material 55 include glass, ceramics, hard plastics, and the like having a light guiding property, among of which the glass is particularly effective. The thickness of the plate material can be 100 μm or lower in view of the suppression of light exiting through the end face of the plate material due to the light guide through the plate material. Further in view of the formation of the concavo-convex shape on the surface, the thickness should be 20 μm or larger in view of manufacturing perspective. The method for forming the surface concavo-convex shape with a surface roughness gradation on the surface of the transparent plate material can employ the same method as in the fourth exemplary embodiment, and accordingly, a description thereof will be omitted here.

In the semiconductor light emitting device according to the present exemplary embodiment, the wavelength conversion layer may be one in which the phosphor particles are dispersed in a general resin uniformly or those described in the previous first to third exemplary embodiments.

The semiconductor light emitting device according to the present exemplary embodiment can be produced by forming a wavelength conversion layer on a wired light emitting element, pasting a transparent plate material like as described above to the layer, and, if required, forming a light reflection layer therearound.

According to the present exemplary embodiment, the transparent plate material for covering the wavelength conversion layer (light extracting layer) can be made of a material having a light guiding function, and the surface thereof can be roughened from the first end side to the second end side continuously and gradually to produce a luminance distribution 57 or 57' gradually varied from the first end side to the second end side with a certain luminance gradation. This configuration can also provide the same or similar advantageous effects to those of the first to fourth exemplary embodiments.

The present exemplary embodiment can include a transparent plate material provided over or above the wavelength conversion layer with a refraction index gradient to form a luminance distribution with a luminance gradation. In general, the higher the refractive index is, a higher ratio of total reflected light at the boundary between air and the material and a lower ratio of exiting light are obtained. In the light emitting device of the present exemplary embodiment, the wavelength conversion layer or the transparent plate material can be used by dividing it into a plurality of areas, and utilizing and arranging a plurality of materials (glass or resin, for example) having respective different refractive indices corresponding to the divided areas so that the refractive indices can be varied from the first end side to the second end side. In this manner, the semiconductor light emitting device of the present exemplary embodiment can have a luminance distribution with the maximum luminance at the first end side and decreasing toward the second end side gradually.

If the wavelength conversion layer is formed of a material in which phosphor particles and a filler are dispersed in a resin, the refractive index of the plate material can be changed by adjusting the kind of used resin, the kind and amount of filler, and the like. Specifically, one example as a resin for the wavelength conversion layer can be a silicone resin or an epoxy resin with a refractive index of 1.41 to 1.60. This means the refractive index of the plate material can be varied within the above range. Furthermore, if a silica particle is added as a filler in an amount of 1.5 wt % to a silicone resin with a refractive index of 1.4, then the resulting material can have almost the same refractive index. However, it is confirmed that if a titanium oxide particle is added in the same amount to the same silicone resin, the resulting material can have a refractive index of 2.3. In the above examples, the total luminous flux emitted from the light emitting device can be 205 lm in the former case where the refractive index is smaller than the latter, whereas the total luminous flux can be 139 lm in the latter case. Accordingly, this can prove the luminous change due to the refractive index change. As described above, the kind of resin, the kind and amount of filler, and the like can be appropriately selected and combined to adjust the reflective index in a desired area.

A method for producing a wavelength conversion layer having different refractive indices at respective areas can be achieved by preparing a block with layered plate materials with different refractive indices (layer deposition can be achieved by the same or similar method to the second or fifth exemplary embodiment and with reference to FIG. 8), and then cutting the block in the direction perpendicular to the layered direction. The cut plate material for the wavelength conversion layer can be pasted onto a wired light emitting element.

As described above, the semiconductor light emitting devices according to the respective exemplary embodiments can have the specific configurations of the wavelength conversion layer or the transparent plate material for forming a gradually varied luminance distribution on the light emission surface. Accordingly, some of these exemplary embodiments can be combined to form another configuration as long as the advantageous effects can be achieved.

For example, the previous exemplary embodiments can include a light emitting element having general optical characteristics in which the maximum luminous can exist on the center of the light emission surface and the luminance can be gradually decreased toward its periphery. However, the presently disclosed subject matter can include a mode in which a light emitting element having a maximum luminosity at one side and luminance distribution gradually decreasing toward the other side. This type of light emitting element can be used in any of the previous exemplary embodiments, namely, by combining it with the wavelength conversion layer or the transparent plate material so that the resulting light emitting device can have a luminance distribution on its light emission surface at the first end side.

As an eighth exemplary embodiment, a light emitting element with a luminance gradation will be described with reference to FIGS. 14A to 14C. FIG. 14A is a top view of the light emitting element, FIG. 14B is a side view thereof, and FIG. 14C is a schematic graph taken along the first end side 140a to the second end side 140b.

As shown in FIG. 14B, the light emitting element can include a sapphire substrate 141, and an n-type semiconductor layer 142, an active layer 143, a p-type semiconductor layer 144, and a p electrode 145 including a reflection electrode 1451 and a transparent electrode 1452, and n electrode 146 electrically connected to the n-type semiconductor layer 142, all of which are deposited in this order on the sapphire substrate 141. The surface of the sapphire substrate 141 can serve as the light emission surface. A number of convex portions and concave portions (in the drawing, only the concave portions are shown) can be formed on the surface of the sapphire substrate 141 as a light extracting structure 147. The structure 147 can be configured, as shown in FIG. 14A viewed from above, so that the portions are not arranged uniformly, but arranged densely at the first end side 140a and arranged coarsely at the second end side 140b. This configuration can produce a difference in light extracting efficiency between at the first end side 140a and the second end side 140b to provide a luminance distribution with a maximum luminance at the first end side 140a as shown in FIG. 14C.

The present exemplary embodiment can have a specific light extracting structure as shown in FIGS. 14A and 14B, but this is not limitative.

A description will now be given of a vehicle light of the presently disclosed subject matter with reference to several exemplary embodiments. The vehicle light can utilize the semiconductor light emitting device of any of the above configurations, namely, having a luminance distribution gradually varied from the first end side to the second end side. The semiconductor light emitting device can be disposed such that the light from the maximum luminance portion at the first end side can be projected as an upper light component while the light from the gradually decreasing luminance portion closer to the second end side can be projected as a lower light component. Actual arrangement of the semiconductor light emitting device may depend on the type of the vehicle light. Hereinafter, the vehicle light according to first to fourth exemplary embodiments will be described with regard to the concrete arrangement of the semiconductor light emitting device and the formed light distribution pattern.

Figure 15:
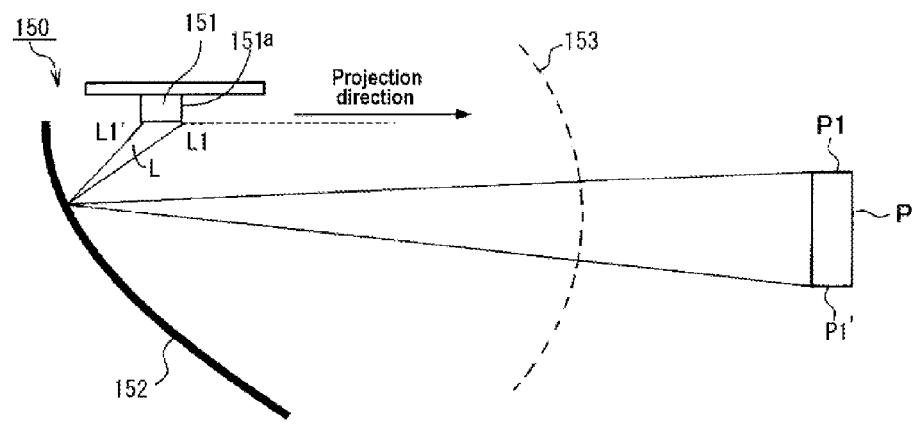
FIG. 15 is a schematic cross-sectional view showing a vehicle light made in accordance with principles of the presently disclosed subject matter according to a first exemplary embodiment.
Figure 16:
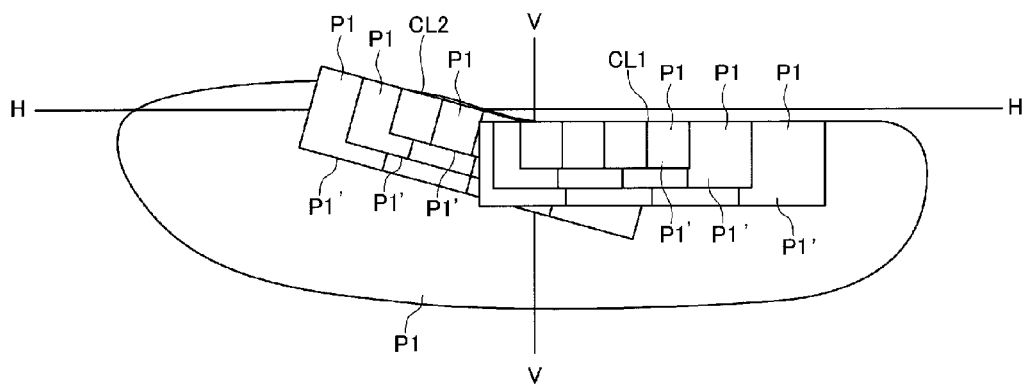
FIG. 16 is a schematic view of a horizontally long light distribution pattern of the vehicle light of FIG. 15.

As shown in FIG. 15, the first exemplary of the vehicle light will be described. The vehicle light 150 can include a semiconductor light emitting device 151, a reflector 152 configured to reflect light emitted from the semiconductor light emitting device 151 in a horizontal direction, and a cover glass 153. The semiconductor light emitting device 151 can be disposed so that the light emission surface (illumination direction) is directed downward, and the reflector 152 can be disposed below the semiconductor light emitting device 151 so as to cover the light emission surface. The reflector 152 can have a function for projecting a light source image(s) of the light source in the forward direction of the vehicle body and forming a desired light distribution pattern P for a headlamp on a virtual vertical screen assumed to be disposed in front of the vehicle light. Specifically, the reflector 152 can be a revolved paraboloid having a focal point disposed at or near the semiconductor light emitting device 151, and it should be appreciated that the reflector 152 can be composed of a plurality of small separated reflection regions, and is of a type referred to as a "multi-reflector." This reflector 152 can direct the light to the cut-off line or lower area in the desired light distribution. This configuration can form the desired light distribution pattern P including a desired cut-off line including a horizontal cut-off line CL1 and an oblique cut-off line CL2 (for example, by an angle of 15 degrees with respect to the horizontal direction), as shown in FIG. 16.

The semiconductor light emitting device can have a plurality of light emitting elements 12 and a wavelength conversion layer 13 covering the array of the light emitting elements 12 as shown in FIG. 1A or 10. The formed luminance distribution when observed in a direction parallel to the light emission surface and perpendicular to the array direction of the light emitting elements 12 can be gradually decreased from the maximum luminance area at the first end side 13a to the second end side 13b as shown in, for example, FIG. 2B. The semiconductor light emitting device 151 with such a luminance distribution can be disposed in the vehicle light 150 shown in FIG. 15 such that the array direction of the light emitting elements 12 is coincident with the width direction of a vehicle body (direction perpendicular to the paper surface of FIG. 15) and the first end side 151a where the maximum luminance can be obtained is disposed closest to the cover glass 153.

With this configuration, the light L emitted from the semiconductor light emitting device 151 can be reflected by the reflector 152, and projected in the projection direction as shown by an arrow in the drawing. In this case, the light L1 from the first end side 13a can reach the upper edge P1 of the light distribution pattern P on the virtual vertical screen and the light L1' from the second end side 13b can reach the lower edge P1' thereof. Accordingly, the light distribution pattern in which clear cut-off lines CL1 and CL2 can be formed with clear dark/bright areas while the maximum luminance can be arranged on or near the cut-off line.

FIG. 15 shows the vehicle light with the semiconductor light emitting device 151 facing downward, but the presently disclosed subject matter is not limited thereto.

Figure 17:
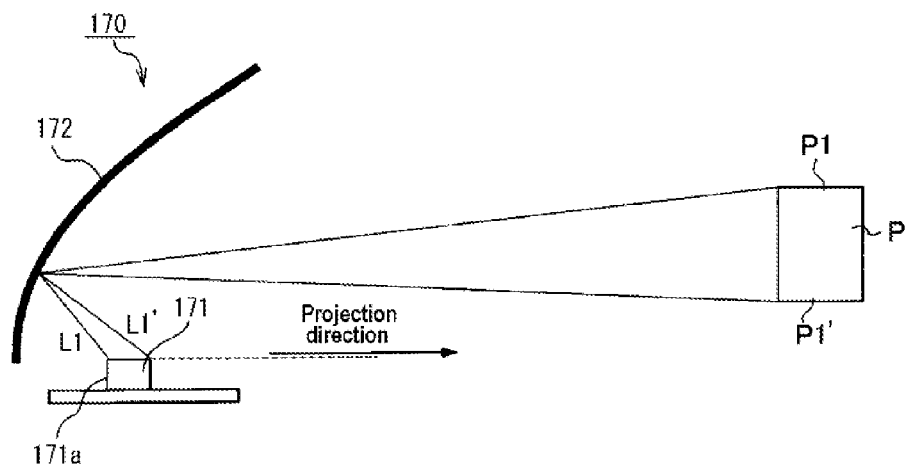
FIG. 17 is a schematic cross-sectional view showing a vehicle light made in accordance with principles of the presently disclosed subject matter according to a second exemplary embodiment.

As a second exemplary embodiment of the vehicle light, FIG. 17 shows a vehicle light 170 with a semiconductor light emitting device 171 disposed on a different position. The vehicle light 170 can include the semiconductor light emitting device 171 facing upward, and accordingly, a reflector 172 can be disposed above the semiconductor light emitting device 171. The reflector 152 can have a function for projecting a light source image(s) of the light source in the forward direction of the vehicle body and forming a desired light distribution pattern P for a headlamp on a virtual vertical screen assumed to be disposed in front of the vehicle light as in the previous vehicle lamp shown in FIG. 15.

In the vehicle light 170, the first end side 171a where the maximum luminance can be obtained is disposed farthest from the cover glass (not shown) so as to obtain a light distribution pattern P with the cut-off line (edge P1) where the maximum luminance can be achieved.

Although the above vehicle lights do not include a shade plate or the like, a vehicle light can include a shape plate or the like. A description will be given of the exemplary embodiment of the vehicle light with a shade plate with reference to FIGS. 18 and 19.

Figure 18:
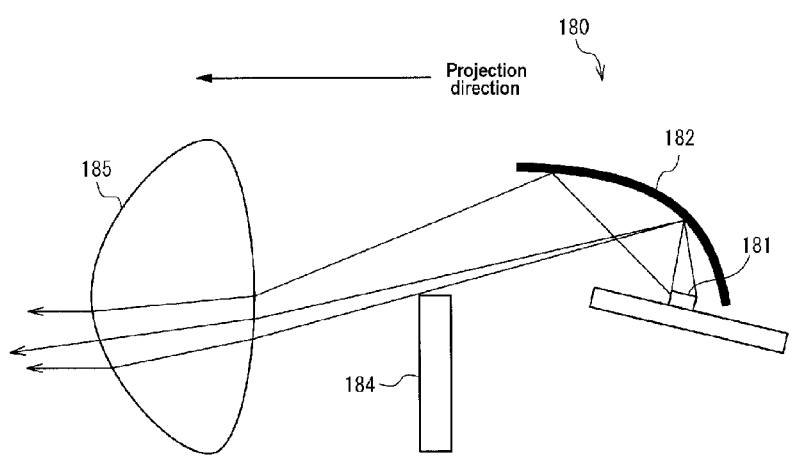
FIG. 18 is a schematic cross-sectional view showing a vehicle light made in accordance with principles of the presently disclosed subject matter according to a third exemplary embodiment.

The vehicle light 180 shown in FIG. 18 can include a semiconductor light emitting device 18, a reflector 182, a shade 184, a projection lens 185, and other projection optical system components. The semiconductor light emitting device 181 can be disposed to face upward so that the first end side where a maximum luminance can be achieved is disposed closest to the projection lens 185. The reflector 182 can be disposed above the semiconductor light emitting device 181 so as to reflect light from the semiconductor light emitting device 181 to the projection direction (to the projection lens 185).

The shade 184 can be a shading member for forming a clear cut-off pattern by shielding part of the reflected light from the reflector 182 and disposed between the projection lens 185 and the semiconductor light emitting device 181 so that the upper edge thereof is located at or near the focal point of the projection lens 185.

The light image reflected by the reflector 182 can be shaped to be disposed densely in the horizontal direction and the oblique direction by 15 degrees with respect to the horizontal direction, so that the clear horizontal cut-off line CL1 and the oblique cut-off line CL2 as shown in FIG. 16 can be formed.

Figure 19:
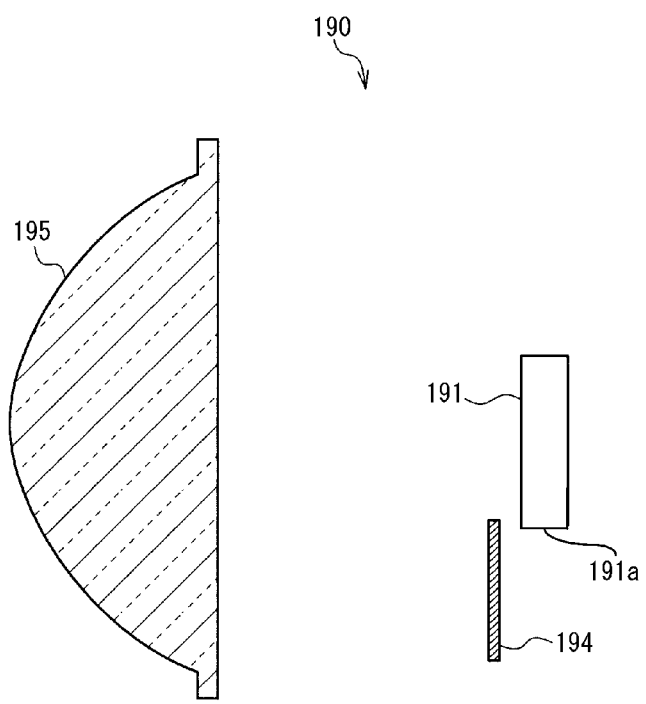
FIG. 19 is a schematic cross-sectional view showing a vehicle light made in accordance with principles of the presently disclosed subject matter according to a fourth exemplary embodiment.

The vehicle light 190 shown in FIG. 19 can include a semiconductor light emitting device 191, a shade 194, a projection lens 195 and other projection optical system components.

The semiconductor light emitting device 191 can be disposed with the light emission surface directed to the projection lens 195 and with the first end side 191a where a maximum luminance can be achieved being disposed lower side.

The shade 194 can be a shading member for forming a clear cut-off pattern by shielding part of the light from the semiconductor light emitting device 191 and disposed between the projection lens 195 and the semiconductor light emitting device 191 so that the upper edge thereof is located at or near the focal point of the projection lens 195.

The light image from the semiconductor light emitting device 191 can be shaped to be disposed densely in the horizontal direction and the oblique direction by 15 degrees with respect to the horizontal direction, so that the clear horizontal cut-off line CL1 and the oblique cut-off line CL2 as shown in FIG. 16 can be formed.

If the presently disclosed subject matter is applied to a vehicle light with a shading member as shown in FIGS. 18 and 19, since the maximum luminance is achieved at the first end side in the light emitting device, only a part of light at the maximum luminance side can be shaped by the shading member so that the light emitting state of the light emitting device can be effectively utilized. In addition, the luminance gradation pattern (luminance distribution) of the light emitting device can be utilized for forming the luminance gradation in the light distribution pattern. Accordingly, the light utilization efficiency of the vehicle light can be improved. Namely, only a small amount of light is shaded by the shading member to be shaped to an optical light distribution, thereby suppressing the lowering of the light utilization efficiency. In addition, the shading member can receive energy less than that in the conventional vehicle light. Accordingly, it is possible to reduce the amount of heat unnecessarily applied to the shading plate.

The vehicle light made in accordance with the principles of the presently disclosed subject matter can be used as a high-beam light, a low-beam light, a fog lamp, and the like, and various lights required to have a clear cut-off line in its light distribution pattern.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A vehicle light comprising:
   a semiconductor light emitting device configured as a light source; and
   a projection optical system configured to project an image from the light source forward to form a light distribution pattern for a headlamp on a virtual vertical screen located in front of the vehicle light, wherein
   the semiconductor light emitting device includes at least one semiconductor light emitting element having a light emission surface, a first end and a second end and at least one light extracting layer deposited on the light emission surface, the light extracting layer including a wavelength conversion layer, the at least one semiconductor light emitting element being arrayed so as to be coincident with a width direction of a vehicle body, the first end being positioned at a front portion of the light source and the second end being positioned at a rear portion of the light source in a direction parallel to the light emission surface and perpendicular to the width direction,
   wherein the wavelength conversion layer includes phosphor particles with a density distribution having a certain gradient in the direction parallel to the light emission surface and perpendicular to the width direction,
   wherein the light extracting layer has an optical characteristic that changes from the first end to the second end in the direction parallel to the light emission surface and perpendicular to the width direction of the vehicle body so that the semiconductor light emitting device forms a luminance distribution with a maximum luminance at the first end and a minimum luminance at the second end, the luminance distribution being continuously decreased from the maximum luminance at the first end to the minimum luminance at the second end, and wherein light from the first end where the luminance distribution shows the maximum luminance can reach an upper end of the light distribution pattern and light from the second end where the luminance distribution shows the minimum luminance can reach a lower end of the light distribution pattern which is opposed to the upper end.

2. The vehicle light according to claim 1, wherein the semiconductor light emitting device is disposed in the vehicle light such that the light distribution pattern of light projected from the vehicle light has a maximum luminance at the upper end in a vertical direction and a minimum luminance at the lower end.

3. The vehicle light according to claim 1, wherein the light extracting layer of the semiconductor light emitting device includes a plurality of light extracting portions with different optical characteristics, and the plurality of light extracting portions are disposed in an order of luminance on the light emission surface from a first end side to a second end side.

4. A semiconductor light emitting device comprising:
at least one semiconductor light emitting element having a light emission surface and having a first end and a second end, the at least one semiconductor light emitting element being arrayed in a certain direction, the first end being positioned at a front portion of the semiconductor light emitting element and the second end being positioned at a rear portion of the semiconductor light emitting element in a direction parallel to the light emission surface and perpendicular to the certain direction; and
at least one light extracting layer deposited on the light emission surface and having a wavelength conversion layer, the wavelength conversion layer including a wavelength conversion material with a density distribution having a certain gradient in the direction parallel to the light emission surface and perpendicular to the width direction, wherein
the light extracting layer includes an optical characteristic that changes from the first end to the second end in the direction parallel to the light emission surface and perpendicular to the width direction of the vehicle body so that the semiconductor light emitting device forms a luminance distribution with a maximum luminance at the first end and a minimum luminance at the second end, the luminance distribution being continuously decreased from the maximum luminance at the first end to the minimum luminance at the second end.

5. The semiconductor light emitting device according to claim 4, wherein the wavelength conversion layer is prepared by dispersing the wavelength conversion material in a resin, whereby an amount of the wavelength conversion material contained in a unit volume when the wavelength conversion layer is equally divided in a thickness direction is constant from a first end side to a second end side, and a density distribution of the wavelength conversion material is varied from the first end side to the second end side.

6. The semiconductor light emitting device according to claim 5, wherein the density distribution of the wavelength conversion material has a distribution in the thickness direction of the wavelength conversion layer that is uniform at the second end side and is higher at an area adjacent to the light emitting element as it is closer to the first end side.

7. The semiconductor light emitting device according to claim 4, wherein an average particle diameter of a wavelength conversion material contained in the wavelength conversion layer is varied from a first end side to a second end side.

8. The semiconductor light emitting device according to claim 4, wherein a type of wavelength conversion material contained in the wavelength conversion layer is varied from a first end side to a second end side.

9. The semiconductor light emitting device according to claim 4, wherein a combination of wavelength conversion materials contained in the wavelength conversion layer is varied from a first end side to a second end side.

10. The semiconductor light emitting device according to claim 4, wherein a surface of the light extracting layer has a surface roughness varied from a first end side to a second end side.

11. The semiconductor light emitting device according to claim 10, wherein the light extracting layer includes the wavelength conversion layer and a transparent layer deposited on the wavelength conversion layer, and a surface of the transparent layer has a surface roughness varied from the first end side to the second end side.

12. The semiconductor light emitting device according to claim 4, wherein at least one layer constituting the light extracting layer has a refractive index varied from a first end side to a second end side.

13. A vehicle light comprising:
the semiconductor light emitting device of claim 4 configured as a light source; and
a projection optical system configured to project an image of the light source forward to form a light distribution pattern for a headlamp on a virtual vertical screen located in front of the vehicle light, wherein
the certain direction is a width direction of a vehicle body, and
wherein light from the first end where the luminance distribution shows the maximum luminance can reach an upper end of the light distribution pattern and light from the second end where the luminance distribution shows the minimum luminance can reach a lower end of the light distribution pattern which is opposed to the upper end.

* * * * *